United States Patent [19]

Someno et al.

[11] 4,298,989
[45] Nov. 3, 1981

[54] TUNING APPARATUS

[75] Inventors: Noboru Someno, Tokyo; Michimasa Komatsubara, Chiba; Masakatsu Toyoshima, Tokyo, all of Japan

[73] Assignee: Sony Corporation, Tokyo, Japan

[21] Appl. No.: 111,188

[22] Filed: Jan. 11, 1980

[30] Foreign Application Priority Data

Jan. 17, 1979 [JP] Japan .................. 54-4294

[51] Int. Cl.³ .............................................. H04B 1/06
[52] U.S. Cl. .................. 455/183; 455/161; 455/180; 455/182
[58] Field of Search .............. 455/161, 165, 179, 183, 455/184, 185, 186, 196; 334/11, 16

[56] References Cited

U.S. PATENT DOCUMENTS

| | | | |
|---|---|---|---|
| 4,085,372 | 4/1978 | Mogi | 455/180 |
| 4,087,793 | 5/1978 | Lucas | 455/179 |
| 4,127,821 | 11/1978 | Okada | 455/182 |

*Primary Examiner*—Joseph A. Orsino, Jr.
*Assistant Examiner*—Tommy P. Chin
*Attorney, Agent, or Firm*—Lewis H. Eslinger; Alvin Sinderbrand

[57] ABSTRACT

In tuning apparatus, a sensor senses when a tune indicating signal has been produced by the IF section so as to enable an adjusting circuit to change the tuning condition of the apparatus by a predetermined frequency step and then to disable the adjusting circuit if the tune indicating signal still is sensed following this frequency change so as to maintain the last-attained tuning condition. Alternatively, if the tune indicating signal no longer is sensed after the tuning condition has been changed by the predetermined frequency step, the tuning section is returned to its preceding tuning condition by this predetermined frequency step. Consequently, if the received signal is a high level signal at a frequency within a predetermined range from a broadcast frequency, the tune indicating signal is produced when the tuning condition of the tuning section differs from the broadcast frequency by this predetermined frequency step; and the tuning condition then is changed by this step so as to arrive at the desired broadcast frequency. If, however, the received signal is a low level signal, the tune indicating signal is produced only when the tuning condition of the tuning section coincides with a desired broadcast frequency, and then this tuning condition is changed by one step followed by a return of one step to the proper condition.

18 Claims, 22 Drawing Figures

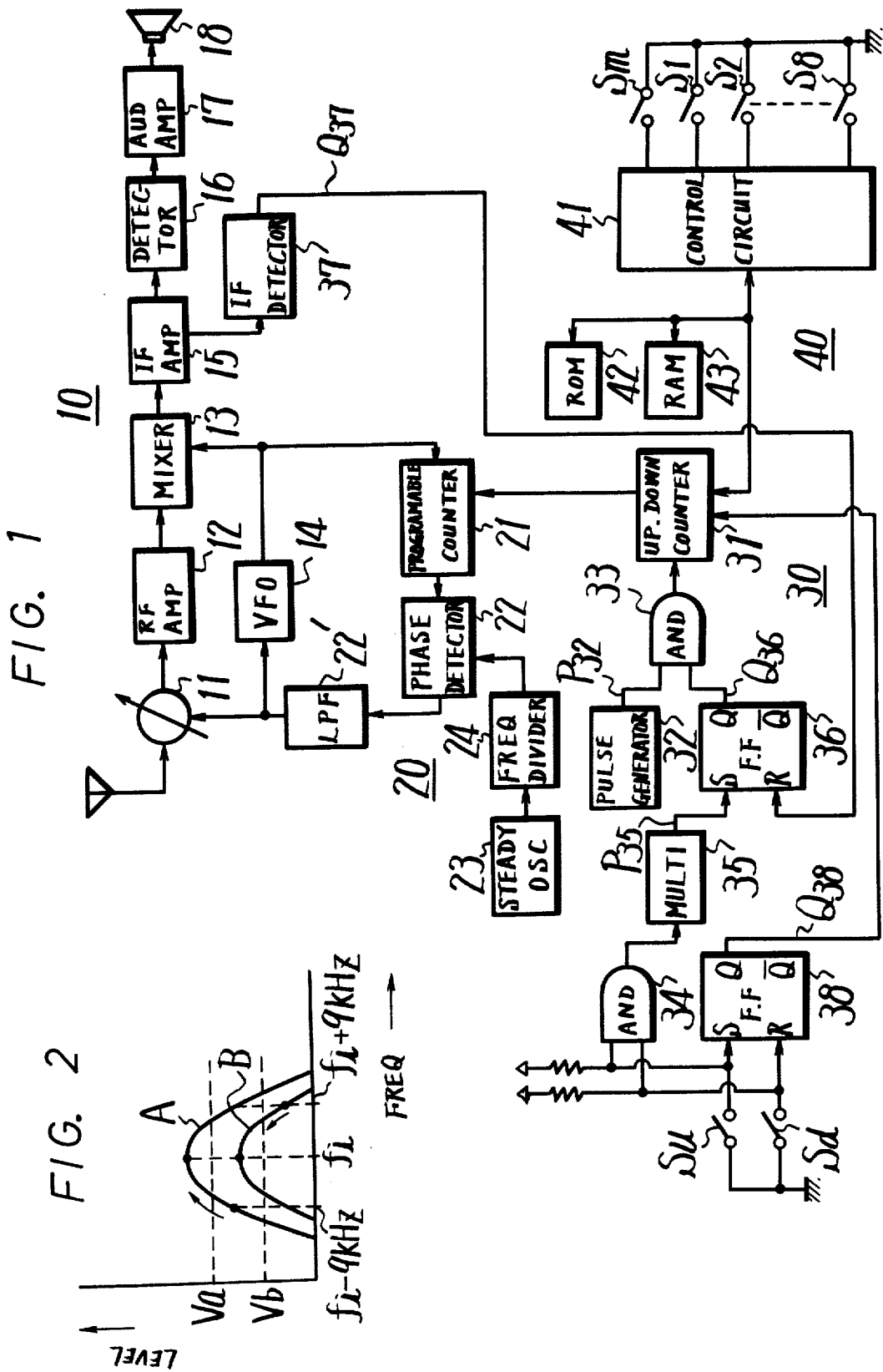

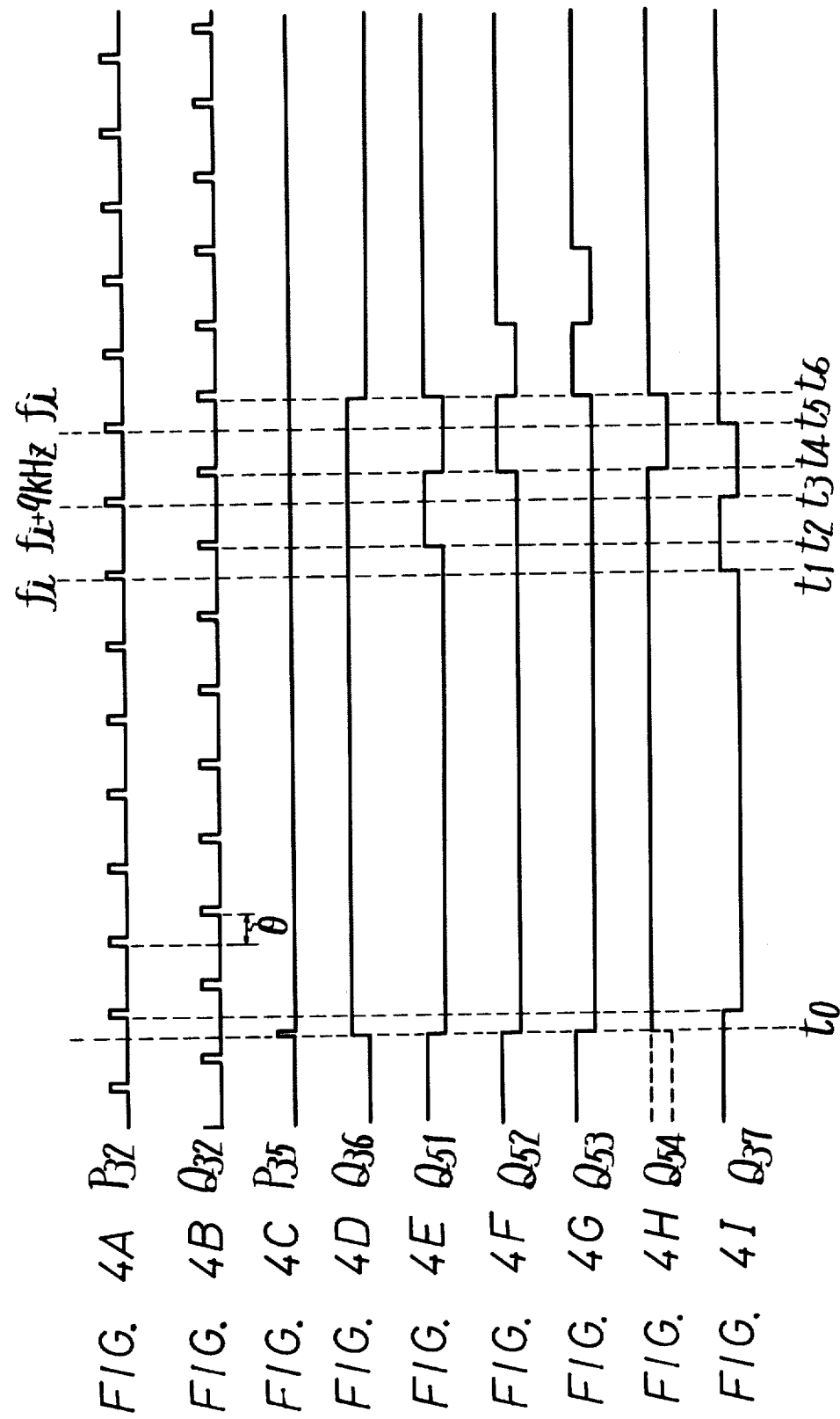

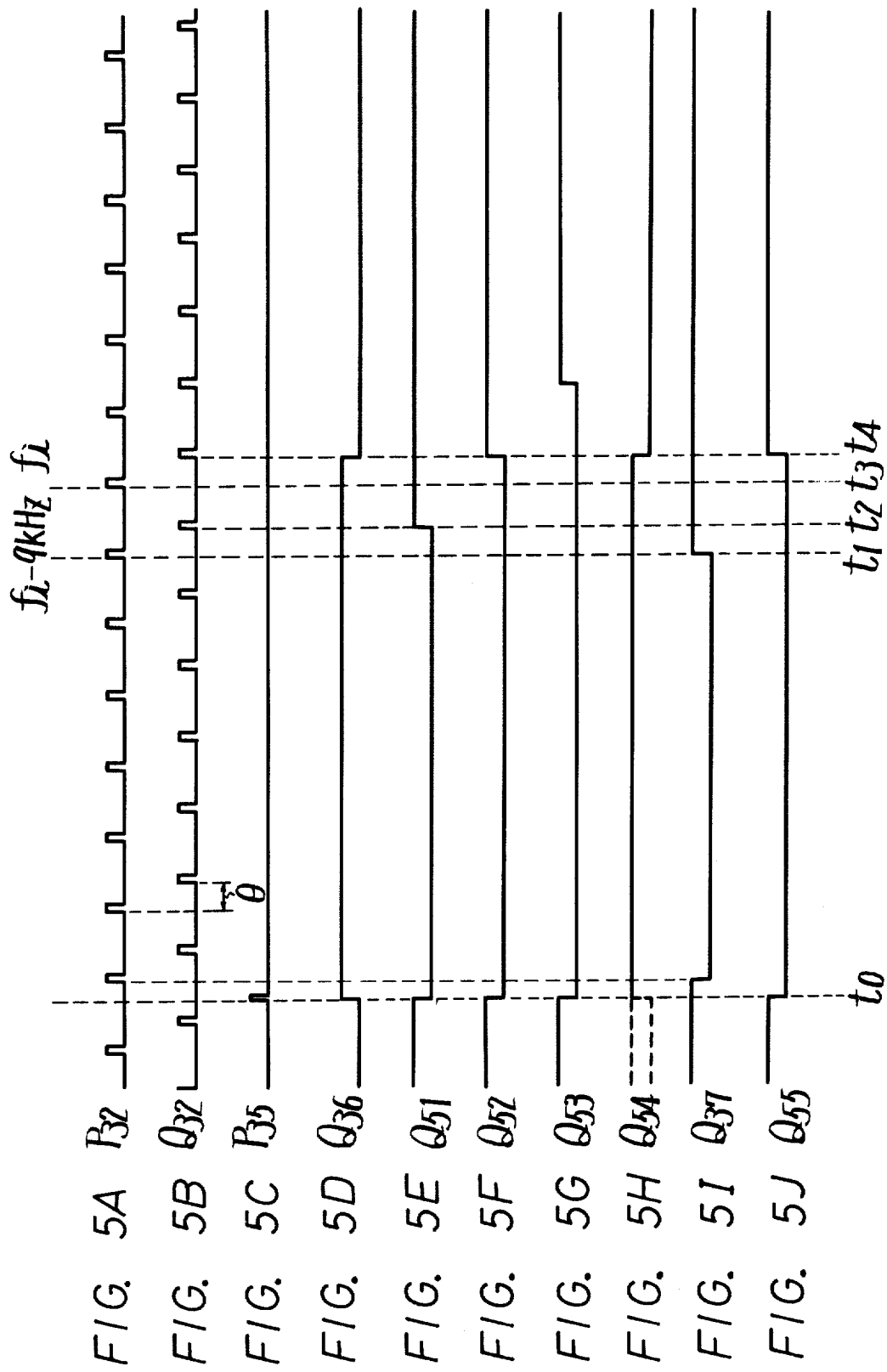

4,298,989

TUNING APPARATUS

BACKGROUND OF THE INVENTION

This invention relates to tuning apparatus for a radio receiver and, more particularly, to such apparatus for use with a frequency-synthesizer type arrangement wherein the tuning condition thereof is accurately controlled so as to receive broadcast frequencies which are separated from each other by relatively small frequency steps, and wherein the tuning section is tuned accurately to a proper broadcast frequency regardless of whether the broadcast signal is a relatively high level or low level signal.

Frequency-synthesizer tuning arrangements have been proposed for FM radio receivers. In such arrangements, the oscillating frequency of a variable oscillator, such as a voltage controlled oscillator (VCO) is determined by a digital number, or count, representing a particular broadcast frequency to which the tuning arrangement is to be tuned. As this digital count changes, the tuning condition of the FM radio receiver likewise changes. The broadcast spectrum can be scanned by the radio receiver merely by incrementing (or decrementing) the digital count, as desired.

Heretofore, such frequency-synthesizer tuning arrangements have been used primarily in FM radio receivers, but not in AM receivers. This is because the frequency separation of adjacent FM broadcast frequencies is relatively high, but AM broadcast frequencies are closely spaced from each other. For example, in the United States, the FM frequency band is within the range of 88 MHz to 108 MHz, with each broadcast channel having a bandwidth of 200 KHz. Hence, to avoid overlapping of adjacent FM broadcast channels in a particular region, adjacent FM broadcast frequencies are separated from each other by multiples of 100 KHz (e.g. adjacent FM broadcast frequencies may be 400 KHz apart). Because of this relatively wide separation between adjacent FM broadcast frequencies, there generally is little difficulty in determining when a true broadcast frequency is received and in precisely tuning the radio receiver to that FM frequency.

However, in the United States, the AM frequency band extends over the range of 535 KHz to 1605 KHz with each broadcast channel having a bandwidth of about 10 KHz (in other countries, such as in Japan, each AM broadcast channel has a bandwidth of 9 KHz). Hence, adjacent AM broadcast frequencies are separated by multiples of 10 KHz (9 KHz in Japan), such that adjacent AM broadcast frequencies may be 20 KHz apart (18 KHz in Japan). Such a narrow bandwidth and close spacing of adjacent AM broadcast frequencies have presented problems in designing frequency synthesizer arrangements for AM radio receivers which are capable of being tuned correctly to a true AM broadcast frequency.

One difficulty in using a frequency synthesizer arrangement in the tuning section of an AM radio receiver is that during the initial "set-up" phase wherein the AM broadcast spectrum may be scanned in order to select desired AM broadcast frequencies for future tuning, such broadcast frequencies may not be received accurately. Typically, an indication that the radio receiver is tuned to a broadcast frequency is derived from the IF detector which normally is provided in the IF section of that receiver. That is, it is assumed that the radio receiver is tuned to a broadcast frequency if the IF signal level exceeds some predetermined threshold level. If the frequency synthesizer scans the AM broadcast spectrum, it is expected that the IF signal level will exceed this threshold level only when the frequency synthesizer arrangement is tuned to a respective broadcast frequency. The scanning operation may be halted at each such indication. However, the setting of the threshold level must be made very carefully. If this threshold level is too high, and if the broadcast signals are relatively low level signals, then even when the frequency synthesizer arrangement is tuned accurately to a broadcast frequency, the signal level of the IF signal may not exceed this high threshold. Consequently, the scanning operation will not be halted, and desired AM broadcast channels will not be received. Conversely, if the threshold level is too low, the IF signal level may exceed this threshold level even when the frequency synthesizer is not yet tuned to the proper broadcast frequency. For example, the tuning condition of the frequency synthesizer may differ from the proper broadcast frequency by a small frequency step $\Delta f$; yet the IF signal which is produced at this tuning condition may have a signal level which exceeds the threshold level. Hence, the scanning operation will be halted even though the radio receiver is not yet tuned to the proper broadcast frequency.

In view of the relatively narrow bandwidth of each AM broadcast channel, and further in view of the close spacing of adjacent AM broadcast frequencies, the aforementioned difficulties are far more serious in AM radio receivers than in FM radio receivers.

OBJECTS OF THE INVENTION

Therefore, it is an object of the present invention to provide improved tuning apparatus for use in a radio receiver.

Another object of this invention is to provide tuning apparatus for a radio receiver in which the tuning apparatus may be tuned accurately to broadcast frequencies even though adjacent ones of such broadcast frequencies are relatively closely spaced to each other, and even though each broadcast channel exhibits a relatively narrow bandwidth.

A further object of this invention is to provide improved tuning apparatus for use in an AM radio receiver which avoids the aforenoted difficulties and problems.

An additional object of this invention is to provide tuning apparatus of the so-called frequency-synthesizer type, wherein the tuning apparatus can be scanned over a spectrum of broadcast frequencies and can be tuned accurately to a received broadcast frequency regardless of whether the signal levels of the broadcast signals are high or low.

Yet another object of this invention is to provide relatively low-cost, accurate tuning apparatus which is digitally implemented and which can be used in a frequency-synthesizer arrangement in a radio receiver.

Various other objects, advantages, and features of the present invention will become readily apparent from the ensuing detailed description, and the novel features will be particularly pointed out in the appended claims.

SUMMARY OF THE INVENTION

In accordance with this invention, tuning apparatus is provided for a radio receiver in which an adjustable tuning section has its tuning condition adjustable over a frequency range so as to be tuned to selectd broadcast frequencies. An IF section is coupled to the tuning section to produce an IF signal whose signal level is a function of the frequency to which the tuning section is tuned. An IF detector detects the level of the IF signal so as to determine whether the tuning section is tuned to a broadcast frequency. If the IF signal level exceeds a threshold level, a tuning indicating signal is produced. This tuning indicating signal thus is produced when the tuning section is tuned properly to a broadcast frequency or, in the event that the broadcast signal is a high level signal, when the tuning section is tuned to a frequency within a predetermined amount of a broadcast frequency. An adjusting circuit changes the tuning condition of the tuning section in predetermined frequency steps either in an upward or downward direction; and a sensing circuit senses if the tune indicating signal has been produced and, if so, enables the adjusting circuit to change the tuning condition by a predetermined frequency step and then disable further changes provided that the tune indicating signal also is sensed following this change. If the tune indicating signal is not sensed following the aforementioned change, the tuning condition is returned by the same predetermined frequency step so as to be returned to that condition in which the tune indicating signal has been sensed.

BRIEF DESCRIPTION OF THE DRAWINGS

The following detailed description, given by way of example, will best be understood in conjunction with the accompanying drawings in which:

FIG. 1 is a block diagram of one type of tuning apparatus which can be used with a radio receiver;

FIG. 2 is a graphical representation showing possible mis-tuning conditions which may occur in the apparatus of FIG. 1;

FIGS. 4A-4I are timing diagrams which are useful in understanding the operation of the present invention; and FIGS. 5A-5J are further timing diagrams which are useful in understanding the operation of this invention.

DETAILED DESCRIPTION OF A PREFERRED EMBODIMENT

Figure 3:
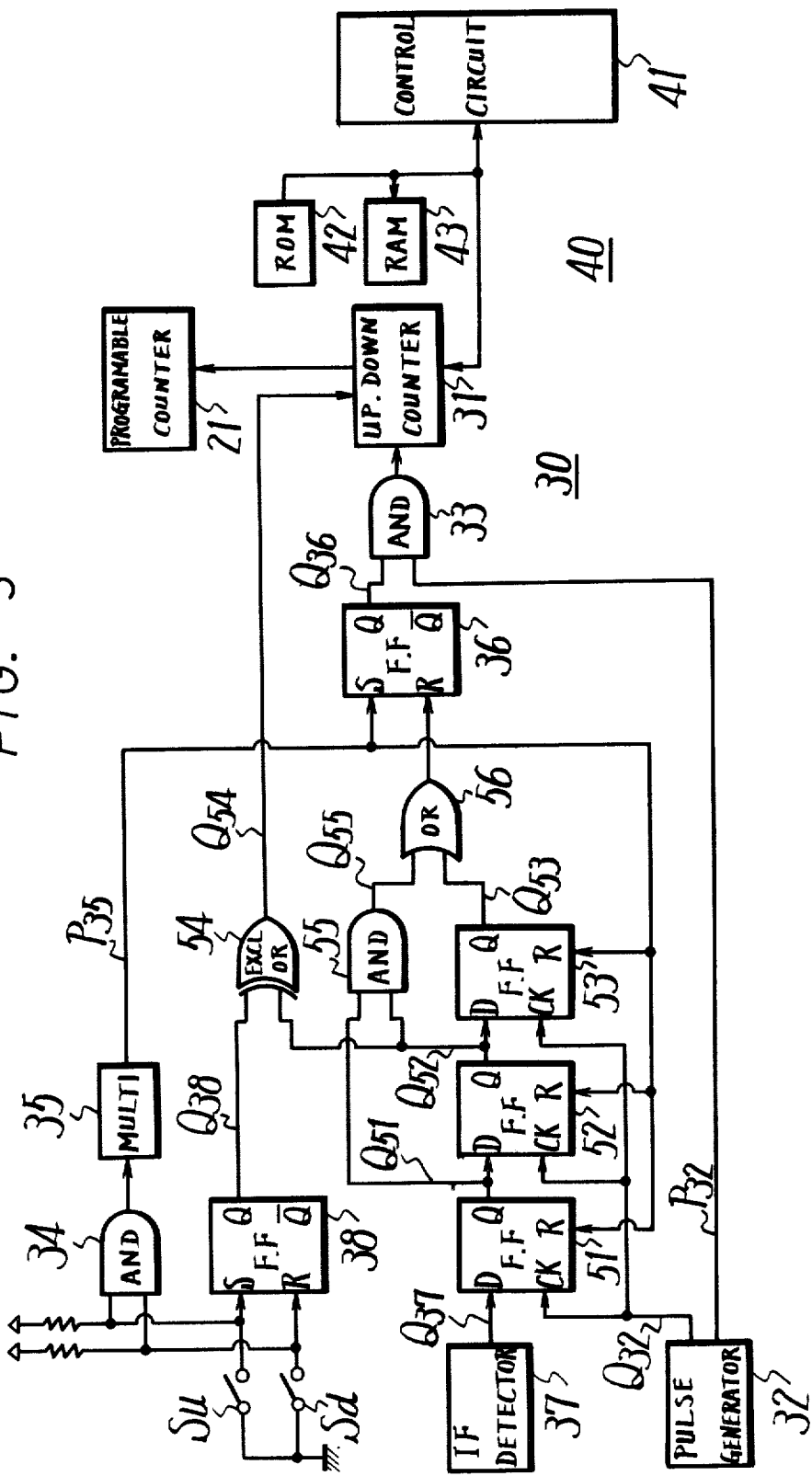
FIG. 3 is a diagram of a portion of the apparatus in accordance with the present invention.

Referring now to the drawings, wherein like reference numerals are used throughout, FIG. 1 is a block diagram representing tuning apparatus of the frequency-synthesizer type which can be used in an AM radio receiver which is broadly designated by the reference numeral 10. The AM radio receiver includes a tuning section comprised of an RF tuning circuit 11, an RF amplifier 12 and a mixer 13. Radio receiver 10 also includes an IF section comprised of IF amplifier 15 and an AM detector 16. Finally, radio receiver 10 includes an audio amplifier 17 and a sound transducer, or loud speaker 18. In the tuning section, RF tuning circuit 11 is coupled to an antenna, or other signal receiving circuit, in order to receive the broadcast signals which are transmitted from various broadcast stations. In the United States, AM broadcast stations transmit broadcast channels in a frequency band from 535 KHz to 1605 KHz, each broadcast channel having a bandwidth of 10 KHz, and adjacent broadcast frequencies being separated by multiples of 10 KHz. In Japan, for example, adjacent broadcast frequencies are separated by multiples of 9 KHz. RF tuning circuit 11 is adjustable and is coupled to RF amplifier 12 to supply received AM broadcast signals in the radio frequency band to the RF amplifier. These RF signals are amplified and supplied to mixer 13 wherein they are heterodyned with a local oscillating signal generated by a variable frequency oscillator VFO 14 which, for example, may comprise a voltage controlled oscillator (VCO). As is understood by those of ordinary skill in the art, depending upon the frequency of the local oscillating signal supplied to mixer 13 by VFO 14, a particular broadcast frequency is converted to an intermediate frequency (IF) signal of a constant IF carrier frequency, this IF carrier being amplitude modulated with the original program information. In the United States the IF carrier frequency is 455 KHz such that if radio receiver 10 is to be tuned to receive the program information transmitted on a broadcast frequency of, for example, 1000 KHz, VFO 14 should produce a local oscillating signal of frequency equal to 1455 KHz. Thus, the tuning condition of radio receiver 10 is determined by the frequency of this local oscillating signal. In order to change the tuning condition thereof, this local oscillating frequency is changed accordingly.

As is conventional, IF amplifier 15 is adapted to amplify the IF signal whose carrier frequency is equal to 455 KHz, hence, IF amplifier 15 is coupled to the output of mixer 13. The amplified IF signal is supplied from this IF amplifier to detector 16 wherein the amplitude modulations of the IF carrier are detected. Thus, detector 16 is adapted to detect, or demodulate the AM program information which had been modulated onto the received broadcast frequency. This program information, which typically consists of audio signal frequencies, is amplified by audio amplifier 17 to drive loudspeaker 18. Thus, the audio program information which had been transmitted by the broadcast station to which radio receiver 10 is tuned can be perceived by the sounds generated by the loudspeaker.

As is conventional, the amplitude, or signal level, of the IF signal is a function of the frequency to which radio receiver 10 is tuned. This IF signal is at a relatively higher level if the radio receiver is tuned to an actual broadcast frequency. Thus, a determination of the tuning condition of radio receiver 10 may be obtained as a function of the detected IF signal level. Such a determination is made by IF detector 37 which is coupled to IF amplifier 15. This IF detector is adapted to generate a tune indicating signal $Q_{37}$ which, for the purpose of the present explanation, is assumed to be a binary "1" if the IF signal level exceeds a predetermined threshold, and to be a binary "0" if the IF signal is less than this threshold. That is, if the frequency of the local oscillating signal generated by VFO 14 is such that the program information broadcast on a predetermined broadcast frequency is detected, IF detector 37 produces the tune indicating signal $Q_{37}$. However, if the tuning condition of radio receiver 10 does not correspond to a received broadcast frequency, that is, if the frequency of the local oscillating signal generated by VFO 14 does not result in demodulated program information, IF detector 37 does not produce the tune indicating signal. This tune indicating signal $Q_{37}$ is used to control a scanning operation of VFO 14, to be described below.

VFO 14 is included in a phase-locked loop 20 which is comprised of a reference oscillator 23, a phase detector 22, a low pass filter 22' and a programmable counter 21. Programmable counter 21 is coupled to the output of VFO 14 and may comprise, for example, a frequency divider having a variable dividing ratio N. This dividing ratio N is adapted to be set by a digital signal, or digital count, supplied to programmable counter 21 by an UP-/DOWN counter 31. More particularly, programmable counter 21 is adapted to count each cycle of the local oscillating signal (which may be amplitude-limited so as to exhibit a rectangular waveform) and to produce an output pulse whenever N cycles have been counted. It is appreciated that the frequency of the output pulses thus produced by programmable counter 21 is equal to 1/N the frequency of the local oscillating signal.

The output of programmable counter 21, that is, the frequency-divided local oscillating signal, is supplied to one input of phase detector 22. This phase detector includes another input adapted to receive a reference oscillating signal derived from reference oscillator 23. This reference oscillating signal exhibits a constant frequency and, preferably, is divided by a frequency divider 24 to a predetermined frequency of, for example, 10 KHz (for use of the present invention in Japan, frequency divider 24 may be adapted to reduce the frequency of the reference oscillating signal to, for example, 9 KHz). This frequency-divided reference oscillating signal (which is referred to hereinafter merely as a reference oscillating signal) of 10 KHz (or 9 KHz) is phase-compared to the frequency-divided local oscillating signal in phase detector 22. The phase detector is adapted to produce an error signal corresponding to any phase differential between these oscillating signals. Such an error signal is supplied via low pass filter 22' as a control signal to VFO 14. This control signal also is supplied to RF tuning circuit 11 so as to adjust the tuning condition thereof.

It may be appreciated that programmable counter 21 is adapted to divide the frequency of the local oscillating signal generated by VFO 14 to a frequency of 10 KHz (or, in Japan, 9 KHz), i.e. the frequency of the reference oscillating signal. If the local oscillating signal exhibits a frequency range of 990 KHz to 2060 KHz, programmable counter 21 should exhibit an adjustable dividing ratio N in the range of 99 to 206. For use of the present invention in Japan, wherein the frequency of the reference oscillating signal supplied to phase detector 22 from frequency divider 24 is equal to 9 KHz, the dividing ratio N of programmable counter 21 should be in the range of 109 to 229. With this range of dividing ratio N, broadcast frequencies from 535 KHz to 1605 KHz can be received (and in Japan, broadcast frequencies of from 531 KHz to 1611 KHz can be received).

The manner in which phase-locked loop 20 controls the VFO 14 so as to establish the tuning condition of radio receiver 10 now will be described. Let it be assumed that the local oscillating frequency of the oscillating signal generated by VFO 14 is equal to 1010 KHz. This means that radio receiver 10 is tuned to a broadcast frequency of 555 KHz. Let it be further assumed that the dividing ratio N of programmable counter 21 is 101 (N=101). Phase detector 22 is supplied with the reference oscillating signal of 10 KHz and a frequency-divided local oscillating signal also of 10 KHz (1010/101 = 10). Now let it be assumed that the dividing ratio N is incremented by one unit such that N=102. The frequency of the local oscillating signal initially remains at 1010 KHz such that phase detector 22 is supplied with a frequency-divided local oscillating signal of 9.9 KHz (1010/102=9.9). The phase detector now detects a phase error between the oscillating signals supplied thereto so as to apply an error signal to VFO 14. This error signal changes the local oscillating frequency from 1010 KHz to 1020 KHz. Once this new local oscillating frequency is attained, the error signal produced by phase detector 22 is reduced to zero. At a local oscillating frequency of 1020 KHz, radio receiver 10 is tuned to receive a broadcast frequency of 565 KHz. Of course, such a broadcast frequency may not be transmitted in the region in which radio receiver 10 is located.

If the dividing ratio N of programmable counter 21 once again is incremented by one unit such that N=103, phase detector 22 is supplied with a frequency-divided local oscillating signal of frequency 9.9 KHz (1020/103=9.9). The phase detector once again applies an error signal to VFO 14 whereby the local oscillating frequency is changed so as to be equal to 1030 KHz. At this new local oscillating frequency, the error signal is reduced to zero. Radio receiver 10 now is tuned to receive a broadcast frequency of 575 KHz.

It now is apparent how the dividing ratio N of programmable counter 21 establishes the tuning condition of radio receiver 10. As this dividing ratio increases, the frequency of the local oscillating signal generated by VFO 14 correspondingly increases. Conversely, as the dividing ratio N decreases, the local oscillating frequency also decreases. The manner in which the dividing ratio N is set now will be described with respect to control circuit 30.

Control circuit 30 is adapted to set the dividing ratio N of programmable counter 21. This dividing ratio N may be incremented or decremented in unit steps or, alternatively, a predetermined dividing ratio N may be set. Control circuit 30 includes up/down counter 31 which is adapted to be supplied with counting pulses and which is capable of counting such pulses in an upward or downward direction, depending upon the state of a direction control signal which also is supplied thereto. Furthermore, the count of up/down counter 31 may be preset by a digital signal which is "loaded" thereinto.

A pulse generator 32, which may be of conventional construction, generates a train of counting pulses $P_{32}$. Such counting pulses are supplied to a pulse input terminal of up/down counter 31 via an AND gate 33. When this AND gate is enabled, the counting pulses $P_{32}$ are supplied therethrough to up/down counter 31. However, when this AND gate is disabled or inhibited, such counting pulses cannot pass to the up/down counter. These counting pulses are used in a scanning operation whereby the count of the up/down counter is incremented or decremented so as to change the dividing ratio N of programmable counter 21 in discrete, unit steps, whereupon the oscillating frequency of VFO 14 likewise is changed in predetermined frequency steps so as to scan the broadcast frequency spectrum.

As mentioned above, one input of AND gate 33 is coupled to pulse generator 32 to receive the counting pulses $P_{32}$ generated thereby. The other input of AND gate 33 is adapted to receive an enable/inhibit signal and is connected to the Q output of a flip-flop circuit 36. This flip-flop circuit is an RS-type bistate device having a positively-triggered set input S coupled to a monostable multivibrator 35. Flip-flop circuit 36 also includes a positively-triggered reset input R connected to the output of IF detector 37. The input of monostable multivibrator 35 is connected to an AND gate 34 and is adapted to be triggered in response to a negative-going transition supplied thereto from this AND gate. AND gate 34 includes a pair of inputs connected to an up-switch $S_u$ and a down-switch $S_d$ respectively. These switches $S_u$ and $S_d$ are manually operative to be closed and thereby supply a relatively low potential, such as ground potential, to the corresponding input of AND gate 34. When the up-switch and down-switch both are opened, relatively higher potentials are supplied to the respective inputs of the AND gate 34 which, in turn, applies a relatively higher potential to monostable multivibrator 35. However, when either of these switches is closed, the low potential applied to the corresponding input of AND gate 34 results in a negative transition in the output signal of this AND gate, thereby triggering monostable multivibrator 35 to supply a pulse to flip-flop circuit 36.

Up-switch $S_u$ also is coupled to the negatively-triggered set input S of an RS flip-flop circuit 38. Down-switch $S_d$ also is connected to the negatively-triggered reset input R of this flip-flop circuit 38. The Q output of this flip-flop circuit is connected to up-down counter 31 to supply the aforementioned direction control signal thereto. If this direction control signal is a binary "1", such as when flip-flop circuit 38 is in its set state, up/down counter 31 is controlled to count in the upward direction. That is, the counting pulses $P_{32}$ supplied to this up/down counter by AND gate 33 increment the count thereof. Conversely, if the direction control signal produced at the Q output of flip-flop circuit 38 is a binary "0", up/down counter 31 is controlled to count in the downward direction. Hence, the count of this up/down counter is decremented in response to each counting pulse supplied thereto.

In operation, let it be assumed that the broadcast frequency spectrum is to be scanned in the upward direction. This is achieved by closing up-switch $S_u$. When this switch is closed, AND gate 34 triggers monostable multivibrator 35 to set flip-flop circuit 36. A binary "1" enable signal $Q_{36}$ is supplied to AND gate 33 from the Q output of flip-flop circuit 36. Hence, counting pulses $P_{32}$ are supplied via this AND gate to up/down counter 31. Also, when up-switch $S_u$ is closed, flip-flop circuit 38 is set such that the direction control signal $Q_{38}$ supplied from the Q output thereof to up/down counter 31 is a binary "1". Consequently, the up/down counter is controlled to count in the upward direction; and the count thereof is incremented in response to each counting pulse supplied thereto.

It is appreciated that, as the count of up/down counter 31 is incremented, the dividing ratio N of programmable counter 21 likewise is incremented. With this change in the dividing ratio of the programmable counter, phase-locked loop 20 adjusts the local oscillating frequency of VFO 14, thereby causing this local oscillating frequency to increase in predetermined frequency steps so as to scan the broadcast frequency. In order to account for the inherent time delay of phase-locked loop 20, the frequency of counting pulses $P_{32}$ may be on the order of about 10 Hz. This frequency is sufficiently slow such that there is ample time for the frequency of the local oscillating signal to be incremented in predetermined frequency steps as the count of up/down counter 31 is incremented.

As the local oscillating frequency is changed, the tuning condition of radio receiver 10 likewise changes. Let it be assumed that one of the broadcast signals which is received by the radio receiver exhibits a broadcast frequency of 645 KHz. When the dividing ratio N is incremented to 110, the frequency of the local oscillating signal then generated by VFO 14 will be equal to 1100 KHz. At this frequency, the tuning condition of radio receiver 10 is tuned to the broadcast frequency of 645 KHz. Hence, the signal level of the IF signal produced at this tuning condition will exceed the threshold level of IF detector 37 which, in turn, produces the tune indicating signal $Q_{37}$. This tune indicating signal $Q_{37}$ may be represented as a binary "1" and is applied to the reset input R of flip-flop circuit 36. This triggers the flip-flop circuit to its reset state so as to change over the binary "1" enable signal $Q_{36}$ provided at the Q output thereof to a binary "0" inhibit signal. Consequently, AND gate 33 is disabled and prevents further counting pulses $P_{32}$ from being supplied to up/down counter 31. This means that the last-attained count is retained in the up/down counter, and the dividing ratio N of programmable counter 21 remains at N=110. Therefore, the local oscillating frequency of VFO 14 remains at 1100 KHz such that radio receiver 10 remains tuned to the broadcast frequency of 645 KHz.

It may be appreciate that, rather than operate up-switch $S_u$, down-switch $S_d$ may be closed. In this condition, flip-flop circuit 38 is reset such that the direction control signal supplied therefrom to up/down counter 31 is a binary "0" to control the up/down counter to count in the downward direction. The foregoing operation is repeated, except that the count of up/down counter 31 is decremented. Hence, the tuning condition of radio receiver 10 is scanned in the downward direction across the broadcast frequency spectrum. Nevertheless, when this tuning condition corresponds to a broadcast frequency, the level of the IF signal supplied to IF detector 37 exceeds the predetermined threshold thereof, whereupon the tune indicating signal $Q_{37}$ is supplied as a binary "1" to the reset input R of flip-flop circuit 36. This changes over the binary "1" enable signal which had been applied to AND gate 33 to a binary "0" disable signal. As a result thereof, the last-attained count of up/down counter 31 is retained therein. Similarly, the dividing ratio N of programmable counter 21 remains at its last value such that the local oscillating frequency of VFO 14 remains fixed. Hence, radio receiver 10 remains tuned to the broadcast frequency determined by this local oscillating frequency.

While the foregoing operation has assumed that the local oscillating frequency is changed in predetermined frequency steps of 10 KHz, other frequency steps may be used, if desired. For example, for use of the illustrated apparatus in Japan, the local oscillating frequency may be incremented or decremented in steps of 9 KHz. In that event, programmable counter 21 is adapted to divide this local oscillating frequency by the factor N×9. Of course, the reference oscillating frequency supplied to phase detector 22 from frequency divider 24 also is equal to 9 KHz.

Up/down counter 31 also is controlled by a control circuit 40 which is adapted to preset the count of the up/down counter to predetermined counts corresponding to predetermined broadcast frequencies. Control circuit 40 includes a central processing unit (CPU) 41 such as a micro-processor, or the like. CPU 41 is coupled, via an interface (not shown) to a read only memory (ROM) 42 and also to a random access memory (RAM) 43. ROM 42 is provided with a program whereby the operation of CPU 41 is controlled. RAM 43 is adapted to store selected counts of up/down counter 31 in addressable memory locations therein. Such counts can be retrieved from these locations and used to set the count of the up/down counter.

Control circuit 40 also is provided with a write switch $S_m$ and selection switches $S_1-S_8$, all shown as being coupled to CPU 41. When write switch $S_m$ is closed, the count then present in up/down counter 31 is adapted to be stored in RAM 43. The particular memory storage location in the RAM in which this count is stored is determined by which of selection switches $S_1-S_8$ is closed. For example, during a scanning operation of the type described hereinabove, if radio receiver 10 is tuned to a desired broadcast frequency (which, it is recalled, is indicated by the binary "1" tune indicating signal $Q_{37}$), the count of up/down counter 31 corresponding to this broadcast frequency may be stored in RAM 43 by closing write switch $S_m$ and a desired one of selection switches $S_1-S_8$. As the radio receiver is tuned to additional broadcast frequencies in accordance with the scanning operation, the counts corresponding to desired ones of these frequencies may be stored in other locations in RAM 43 in a similar manner. That is, by closing write switch $S_m$ and a respective one of selection switches $S_1-S_8$. In the illustrated apparatus, counts corresponding to eight desired broadcast frequencies may be stored.

Radio receiver 10 may be tuned to any of the broadcast frequencies which are represented by the counts stored in RAM 43. The desired tuning condition of the radio receiver may be obtained as follows. Assuming that neither up-switch $S_u$ nor down-switch $S_d$ is operated, the closing of a selected one of selection switches $S_1-S_8$ addresses a corresponding location in RAM 43. The count stored in the addressed location is read out therefrom to up/down counter 31. This presets the up/down counter to the read-out count. This count then sets the dividing ratio N of programmable counter 21 to establish a corresponding frequency of the local oscillating signal generated by VFO 14. Radio receiver 10 then is tuned to the broadcast frequency represented by the count which had been read out from RAM 43. For example, if selection switch $S_2$ is closed, memory location 2 is addressed in RAM 43. The count stored in this memory location 2 is read out to preset up/down counter 31. This count sets programmable counter 21 to a corresponding dividing ratio N. If this count sets the dividing ratio such that N=110, then the local oscillating frequency of VFO 14 is made equal to 1100 KHz, thereby tuning radio receiver 10 to a broadcast frequency of 645 KHz.

It is appreciated that the count stored in any memory location in RAM 43 may be changed, as desired, merely by operating write switch $S_m$ and the selection switch which corresponds to this memory location. With this operation, the count then stored in up/down counter 31, which may be present due to a scan operation, is stored in this addressed memory location.

An attendant disadvantage of the apparatus illustrated in FIG. 1 arises when a received broadcast frequency exhibits a signal level that is either too low or too high. If the received signal level is low, the afore-described scanning operation may not be halted even when radio receiver 10 is tuned to a proper broadcast frequency. If, however, the received broadcast signal level is too high, the scanning operation may be halted prematurely, that is, prior to the time that radio receiver 10 has been tuned to the proper broadcast frequency.

The problems attributed to received signal levels which may be too low or too high are illustrated graphically in FIG. 2. Let it be assumed that a proper broadcast frequency is represented as $f_i$. Let it be further assumed that each incremental change in the count of up/down counter 31 results in a change in the dividing ratio N to correspondingly change the local oscillating frequency by a predetermined frequency step $\Delta f$. It is clear from the foregoing description of the operation of the apparatus illustrated in FIG. 1 that, for use in the United States, $\Delta f=10$ KHz; and for use of the illustrated apparatus in Japan, $\Delta f=9$ KHz. In FIG. 2, curve A represents the IF signal level in response to a high level broadcast signal, as the tuning condition of radio receiver 10 varies about broadcast frequency $f_i$. Curve B represents the IF signal level in response to a low level broadcast signal as the tuning condition of radio receiver 10 varies about broadcast frequency $f_i$. It should be appreciated that, for simplification, curves A and B are shown as continuous curves even though the local oscillating frequency, that is, the tuning condition of radio receiver 10, varies in discrete frequency steps. If the threshold level of IF detector 37 is selected to be equal to level $V_a$, it is seen that the IF signal level represented by curve B, that is, the IF signal level produced in response to a low level broadcast signal, never will exceed threshold level $V_a$. Hence, when radio receiver 10 receives low level broadcast signals, tune indicating signal $Q_{37}$ cannot be produced. This means that the counting pulses $P_{32}$ supplied to up/down counter 31 will not be interrupted. Hence, the scanning operation will not be terminated in response to low level broadcast signals. If the threshold level of IF detector 37 is selected to be at a relatively lower level, represented as level $V_b$ in FIG. 2, then the aforenoted defect will not occur. The IF signal level represented by curve B, that is, the IF signal produced in response to low level broadcast signals, will exceed threshold level $V_b$ only when radio receiver 10 is tuned properly to broadcast frequency $f_i$. Hence, when the threshold level of the IF detector is selected to be relatively low, the scanning operation will be terminated properly when tune indicating signal $Q_{37}$ is produced, i.e., when radio receiver 10 is tuned to broadcast frequency $f_i$. However, an improper tuning condition will be obtained if IF detector 37 is provided with the relatively lower threshold level $V_b$ and a high level signal is received. In this condition, the IF signal level is represented as curve A. Now, when radio receiver 10 is tuned to a frequency equal to $f_i-\Delta f$ or to a frequency $f_i+\Delta f$, that is, to a frequency which differs from the broadcast frequency $f_i$ by a frequency step $\Delta f$, curve A nevertheless will exceed threshold level $V_b$. That is, even though radio receiver 10 is mis-tuned, the signal level of the IF signal produced at the mis-tuned frequency will, nevertheless, exceed threshold level $V_b$. Hence, when radio receiver 10 is tuned to the frequency $f_i \pm \Delta f$, IF detector 37 produces the tune indicating signal $Q_{37}$ to terminate the scanning operation. This means that the radio receiver remains in its mis-tuned condition and will not be further tuned automatically to the desired broadcast frequency $f_i$.

The present invention overcomes the undesired operation represented by the curves shown in FIG. 2. To summarize the operation of the present invention, during a scan mode, the tuning section of the radio receiver is changed by the frequency step $\Delta f$ following the production of the tune indicating signal $Q_{37}$. Once the tuning condition has been so changed, if the tune indicating signal still is produced, then it is assumed that the preceding tune indicating signal had been derived when the radio receiver had been tuned to the frequency $f_i \pm \Delta f$. Hence, by changing the tuning condition by an additional frequency step $\Delta f$, the radio receiver now is tuned to the proper broadcast frequency $f_i$. However, after the first production of the tune indicating signal $Q_{37}$, if this tune indicating signal no longer is produced when the tuning condition had been changed by the frequency step $\Delta f$, it is assumed that the radio receiver had been tuned previously to the proper broadcast frequency $f_i$ and now is tuned to the frequency $f_i \pm \Delta f$. Accordingly, the tuning condition of radio receiver 10 is returned to its preceding condition so as to be tuned to the proper broadcast frequency $f_i$. In the first-mentioned operation, it is assumed that the received broadcast signal is a high level signal; and in the second-mentioned operation, it is assumed that the received broadcast signal is a low level signal. Thus, for the high level signal, the relationship shown by curve A and threshold level $V_b$ occurs. For the low level signal, the relationship between curve B and threshold level $V_b$ occurs.

Turning now to FIG. 3 there is illustrated a block diagram of control circuit 30 in accordance with the present invention. This control circuit is used to control the operation of up/down counter 31 which, in turn, sets the dividing ratio N of programmable counter 21. In the interest of simplification, the tuning section, IF section and audio output section, as well as phase-locked loop 20 of radio receiver 10 are not shown. These elements are identical to those shown in FIG. 1 and, therefore, need not be repeated here.

Control circuit 30, shown in FIG. 3, is provided with pulse generator 32, AND gate 33, AND gate 34, monostable multivibrator 35, RS flip-flop circuit 36, IF detector 37, RS flip-flop circuit 38 and up-switch $S_u$ and down-switch $S_d$, all as discussed previously with respect to the apparatus shown in FIG. 1. These elements all operate in the same manner as was described hereinabove. Hence, in the interest of brevity, further description thereof is not provided.

The embodiment shown in FIG. 3 differs from the apparatus of FIG. 1 in that a shift register comprised of D-type flip-flop circuits 51, 52 and 53 is provided, together with an exclusive-OR gate 54, an AND gate 55 and an OR gate 56. In addition, pulse generator 32 also generates shift pulses $Q_{32}$ which are delayed from counting pulses $P_{32}$ by an amount $\Theta$, which delayed amount is greater than the lock-up time of phase-locked loop 20. That is, a shift pulse $Q_{32}$ is produced at a time after the frequency of the local oscillating signal generated by VFO 14 has been changed so as to correspond to the frequency determined by the count of up/down counter 31.

Each D-type flip-flop circuit is conventional and includes a D input to which a data signal is supplied and a clock input CK to which a shift clock pulse $Q_{32}$ is supplied. The state of the D-type flip-flop circuit is determined by the state (i.e., binary "1" or "0") of the data signal which is received at the time that a shift clock pulse $Q_{32}$ is produced. Each of these flip-flop circuits also includes a reset input R and a Q output. All of the clock inputs CK are connected in common to pulse generator 32 to receive the shifting pulses $Q_{32}$.

The D input of flip-flop circuit 51 is connected to IF detector 37 to receive the tune indicating signal $Q_{37}$ therefrom. The Q output of flip-flop circuit 51 is connected to the D input of flip-flop circuit 52 and also to one input of AND gate 55. The Q output of flip-flop circuit 52 is connected to the D input of flip-flop circuit 53 and also to the other input of AND gate 55. In addition, this Q output is coupled to one input of exclusive-OR gate 54. The other input of this exclusive-OR gate 54 is connected to the Q output of flip-flop circuit 38 to receive the direction control signal $Q_{38}$ therefrom.

The Q output of flip-flop circuit 53 is coupled to one input of OR gate 56, the other input of which is coupled to the output of AND gate 55. The output of this OR gate is connected to the reset input R of flip-flop circuit 36. As in the apparatus of FIG. 1, the set input S of slip-flop circuit 36 is coupled to the output of monostable multivibrator 35. This output also is coupled in common to the reset inputs R of each of D-type flip-flop circuits 51, 52 and 53.

The output of exclusive-OR gate 54 is used as the direction control signal to control the counting direction of up/down counter 31. Hence, as shown, the output of this exclusive-OR gate is connected to the up/down counter. As in the apparatus of FIG. 1, if this direction control signal is a binary "1", the count of up/down counter 31 is incremented; whereas if this direction control signal is a binary "0" the count of the up/down counter is decremented.

The operation of the embodiment illustrated in FIG. 3 now will be described with reference to the timing diagrams shown in FIGS. 4A–4I. Let it be assumed that up-switch $S_u$ is closed. The closure of this switch sets flip-flop circuit 38 to produce a binary "1" direction control signal $Q_{38}$. In addition, the closure of this switch triggers monostable multivibrator 35 to produce output pulse $P_{35}$, as shown in FIG. 4C. This output pulse resets D-type flip-flop circuits 51, 52 and 53; and it also sets flip-flop circuit 36 to produce the enable signal $Q_{36}$ shown in FIG. 4D. This enable signal $Q_{36}$ opens AND gate 33 so as to supply counting pulses $P_{32}$ (shown in FIG. 4A) to up/down counter 31.

When flip-flop circuit 38 is set and D-type flip-flop circuit 52 is reset, exclusive-OR gate 54 is supplied with a binary "1" signal $Q_{38}$ and a binary "0" signal $Q_{52}$. Hence, the exclusive -OR gate produces a binary "1" direction control signal $Q_{54}$ as shown in FIG. 4H. This direction control signal controls up/down counter 31 to count the counting pulses $P_{32}$ in the upward direction.

As the count of up/down counter 31 is incremented at the rate of the counting pulses $P_{32}$, shifting pulses $Q_{32}$ (shown in FIG. 4B as being delayed by the amount $\Theta$ from counting pulses $P_{32}$) are supplied to the shift register constituted by D-type flip-flop circuits 51, 52 and 53. At this time, however, radio receiver 10 is not yet tuned to a broadcast frequency and, consequently, IF detector 37 does not produce the tune indicating signal $Q_{37}$. Thus D-type flip-flop circuits 51, 52 and 53 all remain in their respective reset states, as shown in FIGS. 4E, 4F and 4G respectively.

Let it be assumed that the threshold level of IF detector 37 is equal to the level $V_b$, shown in FIG. 2, and that the received broadcast signals are relatively low level signals, such as shown by curve B. At time $t_1$, the count of up/down counter 31 will have been incremented so as to tune the radio receiver to the broadcast frequency $f_i$. Thus, if the time delay of phase-locked loop 20 is omitted, at time $t_1$, the fact that the radio receiver is tuned to broadcast frequency $f_i$ results in the production of tune indicating signal $Q_{37}$ by IF detector 37. At the next-following shifting pulse $Q_{32}$, shown in FIG. 4B, D-type flip-flop circuit 51 is set. Hence, the signal $Q_{51}$ produced at the Q output thereof is triggered to a binary "1", as shown in FIG. 4E. This occurs at time $t_2$. At this time, however, signals $Q_{52}$ and $Q_{53}$ produced at the Q outputs of D-type flip-flop circuits 52 and 53, each is a binary "0". Hence, AND gate 55 remains disabled and OR gate 56 maintains a binary "0" at the reset input R of flip-flop circuit 36.

At time $t_3$, the next counting pulse $P_{32}$ is supplied to up/down counter 31. This increments the count thereof so as to change the tuning condition of radio receiver 10 by one frequency step $\Delta f$. Thus, the radio receiver now is tuned to the frequency $f_i + \Delta f$. As shown in FIG. 2, threshold level $V_b$ is not exceeded by IF signal level B when the radio receiver is tuned to the frequency $f_i + \Delta f$. Hence, when the tuning condition of the radio receiver is changed by this frequency step, the tune indicating signal $Q_{37}$ produced by IF detector 37 is terminated, as shown in FIG. 4I. At time $t_4$, the next shifting pulse $Q_{32}$ is produced so as to shift the binary "1" stored in flip-flop circuit 51 into flip-flop circuit 52 as shown in FIG. 4F, and to shift the binary "0" tune indicating signal $Q_{37}$ into flip-flop circuit 51, as shown in FIG. 4E. It is appreciated that flip-flop circuit 51 establishes a first time delay (from time $t_2$ to time $t_4$) at the end of which a delayed version of tune indicating signal $Q_{37}$ is provided at the Q output of flip-flop circuit 52. This delayed tune indicating signal is shown at time $t_4$ as the output signal $Q_{52}$ in FIG. 4F. During this time delay, the count of up/down counter 31 is incremented by a unit, or a single counting pulse $P_{32}$ so as to change the tuning condition of the radio receiver.

At the end of this time delay, the tuning condition of the radio receiver has been incremented by one frequency step so as to be tuned to the frequency $f_i + \Delta f$. Since the tune indicating signal $Q_{37}$ no longer is produced, it is seen, from the graphical representation shown in FIG. 2, that the tuning condition of the radio receiver should be returned by one frequency step back to the frequency $f_i$. Since the output signal $Q_{52}$ produced at the Q output of flip-flop circuit 52 now is a binary "1" (shown in FIG. 4F), exclusive-OR gate 54 is supplied with a binary "1" at each input thereof. Consequently, the direction control signal $Q_{54}$ supplied by this exclusive-OR gate to up/down counter 31 is changed over to a binary "0" at time $t_4$, as shown in FIG. 4H.

At time $t_5$, the next counting pulse $P_{32}$ is supplied through AND gate 33 to the up/down counter. This counter now is controlled to count in the downward direction so as to decrement the count thereof by one. This, in turn, decreases the frequency to which the radio receiver is tuned by one frequency step. Since the tuning condition of the radio receiver immediately prior to this decrementing of the count of up/down counter 31 had been equal to the frequency $f_i + \Delta f$, the tuning condition now is returned to be equal to the broadcast frequency $f_i$. Hence, at time $t_5$ when the count of up/down counter 31 is decremented, the fact that the radio receiver once again is tuned to the broadcast frequency $f_i$ results in the production of the tune indicating signal $Q_{37}$ by IF detector 37, as shown in FIG. 4I.

At time $t_6$, the next shifting pulse $Q_{32}$ is produced so as to shift the binary "1" from flip-flop circuit 52 into flip-flop circuit 53, as shown in FIG. 4G, to shift the binary "0" from flip-flop circuit 51 into flip-flop circuit 52, as shown in FIG. 4F, and to shift the binary "1" tune indicating signal $Q_{37}$ into flip-flop circuit 51, as shown in FIG. 4E. It is seen that the combination of flip-flop circuits 51 and 52 establishes a second time delay, which second time delay extends from a time $T_2$ to the time $T_6$. During this second time delay, the count of up/down counter 31 had been incremented by one count so as to change the frequency to which the radio receiver is tuned from $f_i$ to $f_i + \Delta f$, and then decremented by one count so as to return the tuning condition of the radio receiver to the broadcast frequency $f_i$. At the conclusion of this second time delay, that is, at time $t_6$, the output signal $Q_{53}$ produced at the Q output of flip-flop circuit 53 is a binary "1". This is a further delayed version of the tune indicating signal $Q_{37}$, and is supplied to the reset input R of flip-flop circuit 36 via OR gate 56. Consequently, flip-flop circuit 36 is reset at time $t_6$, as shown in FIG. 4D, to disable, or inhibit AND gate 33. This AND gate is, therefore, closed so as to prevent further counting pulses $P_{32}$ from being supplied to up/down counter 31. This means that the last attained count of the up/down counter is retained therein. Since the count of the up/down counter is not changed, the dividing ratio N of programmable counter 21 remains fixed and, therefore, the frequency of the local oscillating signal generated by VFO 14 remains unchanged. Hence, the radio receiver remains tuned to the broadcast frequency $f_i$.

If another upward scanning operation is to be carried out, up-switch $S_u$ is closed and the aforedescribed operation is repeated. That is, up/down counter 31 counts counting pulses $P_{32}$ in the upward direction until the count of this up/down counter establishes a tuning condition of radio receiver 10 corresponding to a broadcast frequency $f_i$. This tuning condition then is incremented by a further frequency step caused by the incrementing of up/down counter 31. At this new tuning condition, corresponding to a frequency $f_i + \Delta f$, tune indicating signal $Q_{37}$ no longer is produced. Hence, the count of up/down counter 31 is decremented, or returned to its prior count, thereby returning the tuning condition of the radio receiver back to its prior condition. This means that the radio receiver now is returned to a tuned frequency equal to $f_i$. Further scanning is halted.

While the foregoing has described an upward scanning operation, it is appreciated that a downward scanning operation may be carried out in a similar manner merely by closing down-switch $S_d$. When this switch is closed, flip-flop circuit 38 is reset such that the direction control signal $Q_{38}$ is a binary "0". Also, the closing of down-switch $S_d$ triggers monostable multivibrator 35 so as to reset each of D-type flip-flop circuits 51, 52 and 53. Initially, therefore, that is, at time $t_0$, exclusive-OR gate 54 is supplied with a binary "0" at each input thereof so as to produce the direction control signal $Q_{54}$ which also is a binary "0". Hence, up/down counter 31 now is controlled to count in the downward direction.

In this downward scan mode, IF detector 37 produces the tune indicating signal $Q_{37}$ when the radio receiver is tuned to the frequency $f_i$. Up/down counter 31 then is decremented by one count pulse $P_{32}$ so as to change the tuning condition of the radio receiver to the frequency $f_i - \Delta f$. At this time, that is, at the end of the first time delay period, a delayed version of the tune indicating signal is produced at the Q output of flip-flop circuit 52. This output signal $Q_{52}$ is a binary "1", and exclusive-OR gate 54 now is supplied with a binary "1" and a binary "0" (signals $Q_{52}$ and $Q_{38}$, respectively) at each of its inputs. As a result thereof, this exclusive-OR gate supplies up/down counter 31 with a binary "1"

direction control signal $Q_{54}$. As a consequence thereof, the count of the up/down counter is incremented in response to the next counting pulse $P_{32}$ so as to return the tuning condition of radio receiver 10 from the frequency $f_i - \Delta f$ to the broadcast frequency $f_i$. Subsequent to this return of the tuning condition of the radio receiver to the broadcast frequency $f_i$, the second time delay period terminates such that flip-flop circuit 53 supplies a binary "1" signal $Q_{53}$ through OR gate 56 to the reset input R of flip-flop circuit 36. Hence, AND gate 33 is inhibited and the last-attained count of up/down counter 31 remains therein.

Now, let it be assumed that the broadcast signal is a relatively high level signal, such as represented by curve A in FIG. 2. Nevertheless, the threshold level of IF detector 37 corresponds to the level $V_b$. Referring to FIGS. 5A–5J, it is assumed that, at time $t_0$ up-switch $S_u$ is closed. It is recalled that, when this switch is closed, flip-flop circuit 38 is set and monostable multivibrator 35 is triggered. As a result of the triggering of the monostable multivibrator, each of flip-flop circuits 51, 52 and 53 is reset, as shown in FIGS. 5E, 5F and 5G. Furthermore, flip-flop circuit 36 is set, as shown in FIG. 5D, to enable AND gate 33 to pass, or transmit counting pulses $P_{32}$ to up/down counter 31. These counting pulses are shown in FIG. 5A.

When flip-flop circuit 38 is set and flip-flop circuit 52 is reset, exclusive-OR gate 54 is supplied with a binary "1" and a binary "0" at its respective inputs. Consequently, this exclusive-OR gate 54 produces the direction control signal $Q_{54}$ which is equal to a binary "1", as shown by the solid lines in FIG. 5H. As a result thereof, up/down counter 31 is controlled to count the counting pulses $P_{32}$ in the upward direction. Therefore, the count of this up/down counter is incremented.

As the count of up/down counter 31 is incremented, the tuning condition of radio receiver 10 changes so as to scan, in the upward direction, the broadcast frequency spectrum. At time $t_1$, a counting pulse $P_{32}$ increments the count of up/down counter 31 so as to establish a tuning condition equal to the frequency $f_i - \Delta f$. As shown in FIG. 2, if the received broadcast signal is a high level signal, the IF signal level exceeds threshold level $V_b$ (curve A) at the frequency $f_i - \Delta f$. Thus at time $t_1$ (neglecting the lock-up time of phase-locked loop 20), IF detector 37 supplies a binary "1" tune indicating signal $Q_{37}$ to the D input of flip-flop circuit 51, as shown in FIG. 5I.

At time $t_2$, the shifting pulse $Q_{32}$ then produced by pulse generator 32 shifts the tune indicating signal $Q_{37}$ into flip-flop circuit 51, as indicated in FIG. 5E. At this time, the output signal $Q_{51}$ of flip-flop circuit 51 is a binary "1" and the output signal $Q_{52}$ of flip-flop circuit 52 is a binary "0". Hence, AND gate 55 remains disabled. Furthermore, exclusive-OR gate 54 still is supplied with a binary "1" and a binary "0" from flip-flop circuits 38 and 52, respectively. Therefore, the direction control signal $Q_{54}$ supplied to up/down counter 31 remains a binary "1" to control this counter to count in the upward direction.

At time $t_3$, the next counting pulse $P_{32}$ is supplied by AND gate 33 to up/down counter 31 to increment the count thereof by one counting pulse. This change in the count of up/down counter 31 results in a corresponding change in the tuning condition of radio receiver 10 from the frequency $f_i - \Delta f$ to the frequency $f_i$. From FIG. 2, it is seen that, when the radio receiver is tuned to the frequency $f_i$, and when the received signal is a relatively high level signal, IF detector 37 produces the tune indicating signal $Q_{37}$. Thus, at time $t_4$, the next shifting pulse $Q_{32}$ shifts the binary "1", which had been stored previously in flip-flop circuit 51, into flip-flop circuit 52, and the binary "1" tune indicating signal $Q_{37}$ is shifted from IF detector 37 into flip-flop circuit 51. Thus, at time $t_4$, flip-flop circuits 51 and 52 both are set, as illustrated in FIGS. 5E and 5F. That is, at the termination of the time delay established by flip-flop circuit 51 in response to the initial production of tune indicating signal $Q_{37}$, a delayed version of this tune indicating signal is provided at the Q output of flip-flop circuit 52 as output signal $Q_{52}$.

AND gate 55 senses that the delayed version of the tune indicating signal, as represented by output signal $Q_{52}$, coincides with the continuance of the production of this tune indicating signal, as represented by output signal $Q_{51}$ corresponding to the stored tune indicating signal in flip-flop circuit 51. AND gate 55, which now is supplied with a binary "1" at each input thereof, produces a binary "1" signal $Q_{55}$ (shown in FIG. 5J) which is supplied to the reset input R of flip-flop circuit 36 by OR gate 56. This resets the flip-flop circuit, as shown in FIG. 5D, to apply a binary "0" inhibit signal $Q_{36}$ to AND gate 33. Therefore, this AND gate is inhibited from transmitting additional counting pulses $P_{32}$ to up/down counter 31.

It is appreciated that, when AND gate 33 is inhibited, the count which had been attained by up/down counter 31 at time $t_3$ is retained therein. This count establishes the tuning condition corresponding to the broadcast frequency $f_i$.

The aforedescribed operation of the embodiment shown in FIG. 3 in response to a received broadcast signal of high level is substantially the same when a downward scanning operation is performed, as in response to the closing of down-switch $S_d$. Therefore, in the interest of brevity, a duplicative description of such an operation is not repeated.

From the foregoing operation, described with reference to the timing diagrams shown in FIGS. 4 and 5, it is appreciated that the embodiment illustrated in FIG. 3 senses when a tune indicating signal $Q_{37}$ is produced during a scanning operation. Once this tune indicating signal is produced, up/down counter 31 is incremented (or decremented) so as to advance the tuning condition of radio receiver 10 by one frequency step. Then, when tuned to this new frequency, the presence or absence of the tune indicating signal $Q_{37}$ is checked once again. If this tune indicating signal still is present, it is assumed that the received signal is a high level broadcast signal, and the preceding production of the tune indicating signal $Q_{37}$ had occurred when the tuning condition of the radio receiver was within one frequency step of the broadcast frequency. Of course, when the tuning condition of the radio receiver had been advanced by one step, the radio receiver now is tuned to the proper broadcast frequency. However, if, on advancing the tuning condition of the radio receiver by one frequency step, the tune indicating signal $Q_{37}$ no longer is produced, it is assumed that a relatively low level broadcast signal is received; and the preceding tuning condition of the radio receiver was the correct tuning condition. Thus, after advancing the tuning condition of the radio receiver by one step, the tuning condition thereof now is returned to the proper broadcast frequency $f_i$.

Once this tune indicating signal is produced, up/down counter 31 is incremented (or decremented) so as to advance the tuning condition of radio receiver 10 by one frequency step. Then, when tuned to this new frequency, the presence or absence of the tune indicating signal $Q_{37}$ is checked once again. If this tune indicating signal still is present, it is assumed that the received signal is a high level broadcast signal, and the preceding production of the tune indicating signal $Q_{37}$ had occurred when the tuning condition of the radio receiver was within one frequency step of the broadcast frequency. Of course, when the tuning condition of the radio receiver had been advanced by one step, the radio receiver now is tuned to the proper broadcast frequency. However, if, on advancing the tuning condition of the radio receiver by one frequency step, the tune indicating signal $Q_{37}$ no longer is produced, it is assumed that a relatively low level broadcast signal is received; and the preceding tuning condition of the radio receiver was the correct tuning condition. Thus, after advancing the tuning condition of the radio receiver by one step, the tuning condition thereof now is returned to the proper broadcast frequency $f_i$.

If the received broadcast signal is of a relatively high level, and if, at time $t_0$, radio receiver 10 had been tuned to one broadcast frequency and up-switch $S_u$ is operated to initiate a scanning operation, it is appreciated that, in response to the incrementing of up/down counter 31 by a single pulse, radio receiver 10 is tuned to the frequency $f_i + \Delta f$. As shown in FIG. 2, at this tuning condition, IF detector 37 produces the tune indicating signal $Q_{37}$. In response to the next counting pulse $P_{32}$, the count of up/down counter 31 is incremented again, so as to change the tuning condition of the radio receiver. Hence, IF detector 37 no longer produces the tune indicating signal. The first two shifting pulses $Q_{32}$ result in shifting the binary "1" tune indicating signal $Q_{37}$ first produced by detector 37 into flip-flop circuit 52, and shifting the binary "0" produced by IF detector 37, in response to the second incrementing of up/down counter 31, into flip-flop circuit 51. Exclusive OR-gate 54 now is supplied with a binary "1" at each input thereof so as to reverse the counting direction of up/down counter 31. Consequently, in response to the next counting pulse $P_{32}$, the count of the up/down counter 31 is decremented so as to return the tuning condition of radio receiver 10 to the frequency $f_i + \Delta f$. The next shifting pulse $Q_{32}$ shifts the binary "1" from flip-flop circuit 52 into flip-flop circuit 53. Accordingly, and as described hereinabove with respect to the operation in response to a low level broadcast signal, the binary "1" provided at the Q output of flip-flop circuit 53 resets flip-flop circuit 36 to inhibit AND gate 33. This means that the count of up/down counter 31 remains fixed at its last-attained count which, in turn, fixes the tuning condition of radio receiver 10 to the frequency $f_i + \Delta f$.

From the foregoing description, it is seen that, when a scanning operation is initiated and the received broadcast signal is at a relatively high level, the initial operation of the embodiment shown in FIG. 3 is substantially identical to the operation thereof as the broadcast frequency $f_i$ is approached during a scanning operation when the received broadcast signals are relatively low level signals. However, when a scanning operation is initiated and the received broadcast signals are relatively high level signals, the tuning condition of radio receiver 10 is "locked" to the frequency $f_i \pm \Delta f$, depending upon whether the scanning operation is an upward or downward scan. To overcome this premature "locking" of radio receiver 10, up-switch $S_u$ (or down-switch $S_d$) merely is operated once again.

Thus, it is seen that the present invention is an improvement over the apparatus shown in FIG. 1 in that the radio receiver may be tuned accurately to a broadcast frequency $f_i$ regardless of whether the received broadcast signal is a high level or a low level signal. The disadvantages associated with the apparatus of FIG. 1, and described with reference to the graphical representation of FIG. 2, are avoided by the present invention. Thus, even though a relatively low threshold level $V_b$ is selected for IF detector 37, a proper tuning condition is attained regardless of whether the signal level of the received broadcast signal is of the type represented by curve A or is of the type represented by curve B. That is, the tuning condition of the radio receiver is not improperly established to be equal to the frequency $f_i \pm \Delta f$.

While the present invention has been particularly shown and described with reference to a preferred embodiment thereof, it should be readily apparent that various changes and modifications in form and details may be made without departing from the spirit and scope of the invention. For example, the numerical examples set forth hereinabove are intended merely to be illustrative and not limiting. Furthermore, various equivalents of the logic circuit elements which have been described with reference to FIG. 3 may be substituted. Also, it may be appreciated that, in the embodiment shown in FIG. 3, the writing into RAM 43 of the counts reached by up/down counter 31 corresponding to desired broadcast frequencies may be achieved automatically. That is, rather than requiring the manual operation of write switch $S_m$ (FIG. 1), the count then present in the up/down counter 31 may be written into RAM 43 automatically in response to an output signal $Q_{55}$ produced by AND gate 55 or in response to an output signal produced by OR gate 56.

It is intended that the appended claims be interpreted as including the foregoing and various other changes and modifications.

What is claimed is:

1. Tuning apparatus for a radio receiver, comprising an adjustable tuning section having a tuning condition which is adjustable over a frequency range to be tuned to selected broadcast frequencies; an IF section coupled to said tuning section to produce an IF signal; IF detecting means for detecting whether said IF signal corresponds to a signal received on a broadcast frequency to which said tuning section is tuned, said detecting means producing a tune indicating signal when said tuning section is tuned to a broadcast frequency and said received signal is either a relatively high or a relatively low level signal and said detecting means producing said tune indicating signal when said tuning section is tuned to a frequency within a predetermined amount of said broadcast frequency and said received signal is a relatively high level signal; adjusting means for changing the tuning condition of said tuning section in predetermined frequency steps selectively in an upward or downward direction; and sensing means for sensing that said tune indicating signal has been produced to enable said adjusting means to change the tuning condition of said tuning section by predetermined frequency step and then to (a) disable said adjusting means if said tune indicating signal is sensed following the change by said predetermined frequency step of said tuning condition so as to maintain the last-attained tuning condition thereof, or (b) return the tuning condition of said tuning section by said predetermined frequency step if said tune indicating signal is not sensed following said change by said predetermined frequency step of said tuning condition.

2. The tuning apparatus of claim 1 wherein said adjusting means comprises UP/DOWN counting means responsive to counting pulses and a direction control signal supplied thereto to increment or decrement the count thereof, the count of said UP/DOWN counting means being determinative of the tuning condition of said tuning section; a source of counting pulses; and means for selectively supplying said counting pulses to said UP/DOWN counting means.

3. The tuning apparatus of claim 2 wherein said sensing means comprises first delay means for establishing a first time delay in response to the production of a tune indicating signal, during which first delay the count of said UP/DOWN counting means is changed by a predetermined number of said counting pulses; means for determining if said tune indicating signal is still produced after said count of said UP/DOWN counting means has been changed by said predetermined number of counting pulses; and inhibit means operative to inhibit further counting by said UP/DOWN counting means if said tune indicating signal is still produced after said count of said UP/DOWN counting means has been changed by said predetermined number of counting pulses.

4. The apparatus of claim 3 wherein said adjusting means further comprises direction control signal generating means operative to supply an UP/DOWN control signal to said UP/DOWN counting means to establish the direction in which said UP/DOWN counting means counts said counting pulses supplied thereto; and means for changing over said UP/DOWN control signal from one state to another state to reverse the direction in which said UP/DOWN counting means counts said counting pulses when said means for determining determines that said tune indicating signal no longer is produced after said count of said UP/DOWN counting means has been changed by said predetermined number of counting pulses, whereby the count of said UP/DOWN counting means is returned to the count at which said tune indicating signal was produced.

5. The apparatus of claim 4 wherein said sensing means further comprises second delay means for establishing a second time delay in response to the production of a tune indicating signal, said second delay terminating subsequent to said first delay and during which second delay said means for changing over said UP/DOWN control signal is operative to reverse the counting direction of said UP/DOWN counting means such that the count of said UP/DOWN counting means is returned to the count at which said tune indicating signal was produced; said inhibit means being operative at the termination of said second time delay to inhibit further counting by said UP/DOWN counting means.

6. The apparatus of claim 5 wherein said first and second delay means comprise shift register means having an input connected to receive said tune indicating signal and at least first and second outputs, said shift register means further having shift pulse input means to receive shift pulses to shift said tune indicating signal therethrough to said first output and then to said second output; and wherein said source of counting pulses also produces shift pulses synchronized with and phase displaced from said counting pulses.

7. The apparatus of claim 6 wherein said means for changing over said UP/DOWN control signal is responsive to the shifting of said tune indicating signal to said first output of said shift register means.

8. The apparatus of claim 7 wherein said direction control signal generating means comprises UP switch means manually operative to produce a first state for said UP/DOWN control signal to establish a count-up direction for said UP/DOWN counting means, and DOWN switch means manually operative to produce a second state for said UP/DOWN control signal to establish a count-down direction for said UP/DOWN counting means; and wherein said means for changing over said UP/DOWN control signal comprises exclusive-OR means for receiving said UP/DOWN control signal and said first output of said shift register means to supply said first state or said second state to said UP/DOWN counting means.

9. The apparatus of claim 6 wherein said means for selectively supplying said counting pulses to said UP/DOWN counting means comprises gate means for receiving said counting pulses from said source and for supplying same to said UP/DOWN counting means; and bistate means operative to a first state to enable said gate means to supply said counting pulses to said UP/DOWN counting means.

10. The apparatus of claim 9 wherein said inhibit means comprises coincidence gate means having an input coupled to said first output of said shift register means and a second input coupled to receive said tune indicating signal shifted into said shift register means to produce a first inhibit signal when said first output of said shift register means is provided with said tune indicating signal concurrently with the shifting of said tune indicating signal into said shift register means; and an OR gate having an input connected to receive said first inhibit signal and another input connected to said second output of said shift register means for operating said bistate means to a second state in response to said first inhibit signal or to the shifting of said tune indicating signal to said second output of said shift register means to inhibit said gate means from supplying said counting pulses to said UP/DOWN counting means.

11. The apparatus of claim 1 wherein said adjustable tuning section comprises mixing means for mixing a received RF signal with a local oscillating signal to produce said IF signal; adjustable oscillating means for generating said local oscillating signal of variable frequency; programmable frequency dividing means for dividing the frequency of said generated local oscillating signal by a programmable dividing ratio, said programmable dividing ratio being set by said adjusting means; phase-locked loop means for comparing the phase of said frequency-divided local oscillating signal to the phase of a reference oscillating signal to produce an error signal; means for supplying said error signal to said adjustable oscillating means to adjust the frequency of said local oscillating signal; and a source of said reference oscillating signal coupled to said phase-locked loop means.

12. Tuning apparatus for a radio receiver adapted to receive broadcast channels, each broadcast channel having a broadcast frequency and a predetermined bandwidth with adjacent broadcast channels being frequency-separated from each other by a multiple of a basic frequency step, said apparatus comprising an adjustable tuning section having a tuning condition which is adjustable to be tuned to selected ones of said broadcast channels, said adjustable tuning section including frequency synthesizing means for synthesizing a local variable frequency oscillating signal for determining said tuning condition; and IF section coupled to said tuning section to produce an IF signal; IF detecting means for detecting whether said IF signal is produced in response to the tuning of said tuning section to a broadcast channel, said IF detecting means producing a tune indicating signal of predetermined state when said tuning section is tuned to a broadcast channel or is within said basic frequency step of a broadcast channel; UP/DOWN counting means responsive to counting pulses and an UP/DOWN control signal supplied thereto for counting said counting pulses in an upward or downward direction as a function of the state of said UP/DOWN control signal, the count of said UP/DOWN counting means establishing the frequency of the local oscillating signal synthesized by said frequency synthesizing means; a source of said counting pulses; means for supplying said counting pulses from said source to said UP/DOWN counting means; shift register means for receiving said tune indicating signal and having at least first and second outputs, said tune indicating signal being shifted to said first output in synchronism with a change in the count of said UP/DOWN counting means corresponding to a change in the frequency of said local oscillating signal equal to said basic frequency step and said tune indicating signal being shifted to said second output in synchronism with another change in the count of said UP/DOWN counting means corresponding to a change in the frequency of said local oscillating signal equal to another basic frequency step; a source of said UP/DOWN control signal, said UP/DOWN control signal exhibiting a count-up state and a count-down state; means for changing over the state of said UP/DOWN control signal when said tune indicating signal is shifted to said first output of said shift register means; first count inhibit signal generating means for generating a first inhibit signal when said tune indicating signal is shifted to said first output of said shift register means and said IF detecting means continues to produce a tune indicating signal; second count inhibit signal generating means for generating a second inhibit signal when said tune indicating signal is shifted to said second output of said shift register means; and means for inhibiting the supply of said counting pulses to said UP/DOWN counting means in response to said first or second inhibit signal.

13. The tuning apparatus of claim 12 further comprising storage means for storing a representation of the count attained by said UP/DOWN counting means when the supply of counting pulses thereto is inhibited, said stored representation identifying a particular broadcast channel; and read-out means for selectively reading out a stored representation from said storage means to set the count of said UP/DOWN counting means therewith so as to establish the frequency of said local oscillating signal.

14. The apparatus of claim 12 wherein said source of said UP/DOWN control signal comprises up-switch means manually operative to produce a count-up state and down-switch means manually operative to produce a count-down state.

15. The apparatus of claim 14 wherein said means for changing over the state of said UP/DOWN control signal comprises an exclusive -OR circuit having one input connected to receive said UP/DOWN control signal, another input connected to said first output of said shift register means, and an output coupled to said UP/DOWN counting means for determining the counting direction of the latter.

16. The apparatus of claim 14 wherein said means for supplying said counting pulses to said UP/DOWN counting means comprises bistate means set to a first state in response to the manual operation of either of said up-switch and down-switch means; and an AND gate enabled by said first state of said bistate means to said supply said counting pulses to said UP/DOWN counting means.

17. The apparatus of claim 16 wherein said means for inhibiting the supply of counting pulses to said UP/DOWN counting means comprises an OR gate responsive to said first or second inhibit signals to reset first bistate means to a second state.

18. The apparatus of claim 14 further comprising means for clearing said shift register means to an initial condition in response to the manual operation of either of said up-switch or down-switch means.

* * * * *